United States Patent [19]

Barnett et al.

[11] 4,318,938
[45] Mar. 9, 1982

[54] METHOD FOR THE CONTINUOUS MANUFACTURE OF THIN FILM SOLAR CELLS

[75] Inventors: Allen M. Barnett; Bill N. Baron, both of Newark; James V. Masi, Wilmington; T. W. Fraser Russell, Newark, all of Del.

[73] Assignee: The University of Delaware, Newark, Del.

[21] Appl. No.: 43,315

[22] Filed: May 29, 1979

[51] Int. Cl.³ .............................................. H01L 31/18
[52] U.S. Cl. .......................................... 427/75; 427/74
[58] Field of Search .................................... 427/74, 75

[56] References Cited

U.S. PATENT DOCUMENTS 4,127,424 11/1978 Ullery ................................ 427/74 X
4,152,535 5/1979 Deminet et al. ............... 136/89 TF
4,239,553 12/1980 Barnett et al. ....................... 136/256

OTHER PUBLICATIONS

Cherry, "A Concept for Generating Commercial Electrical Power From Sunlight", 1970, pp. 331-337.
Brody et al., "Prognosis for CdS Solar Cells", Proc. Symposium on The Material Aspects of Thin Film Systems for Solar Energy Conversion, 1974, pp. 170-192.
Shirland et al., "Materials for Low-Cost Solar Cells", Rep. Prog. Phys., vol. 41, (1978), pp. 1840-1879.

Primary Examiner—James R. Hoffman
Attorney, Agent, or Firm—Connolly and Hutz

[57] ABSTRACT

A technique for manufacturing durable, reliable solar cells by a continuous process suitable for large-scale manufacture involves, in substance, providing a reel of thin metal foil substrate and forming on the substrate a series of layers operative to form a photovoltaic junction, short prevention blocking layers, contacts and integral encapsulation. The foil substrate is processed as a continuous reel substantially until final testing at which point, if desired, it can be cut into individual cells for deployment. In comparison with a batch process, the continuous technique can reduce manufacturing cost by as much as a factor of two.

15 Claims, 3 Drawing Figures

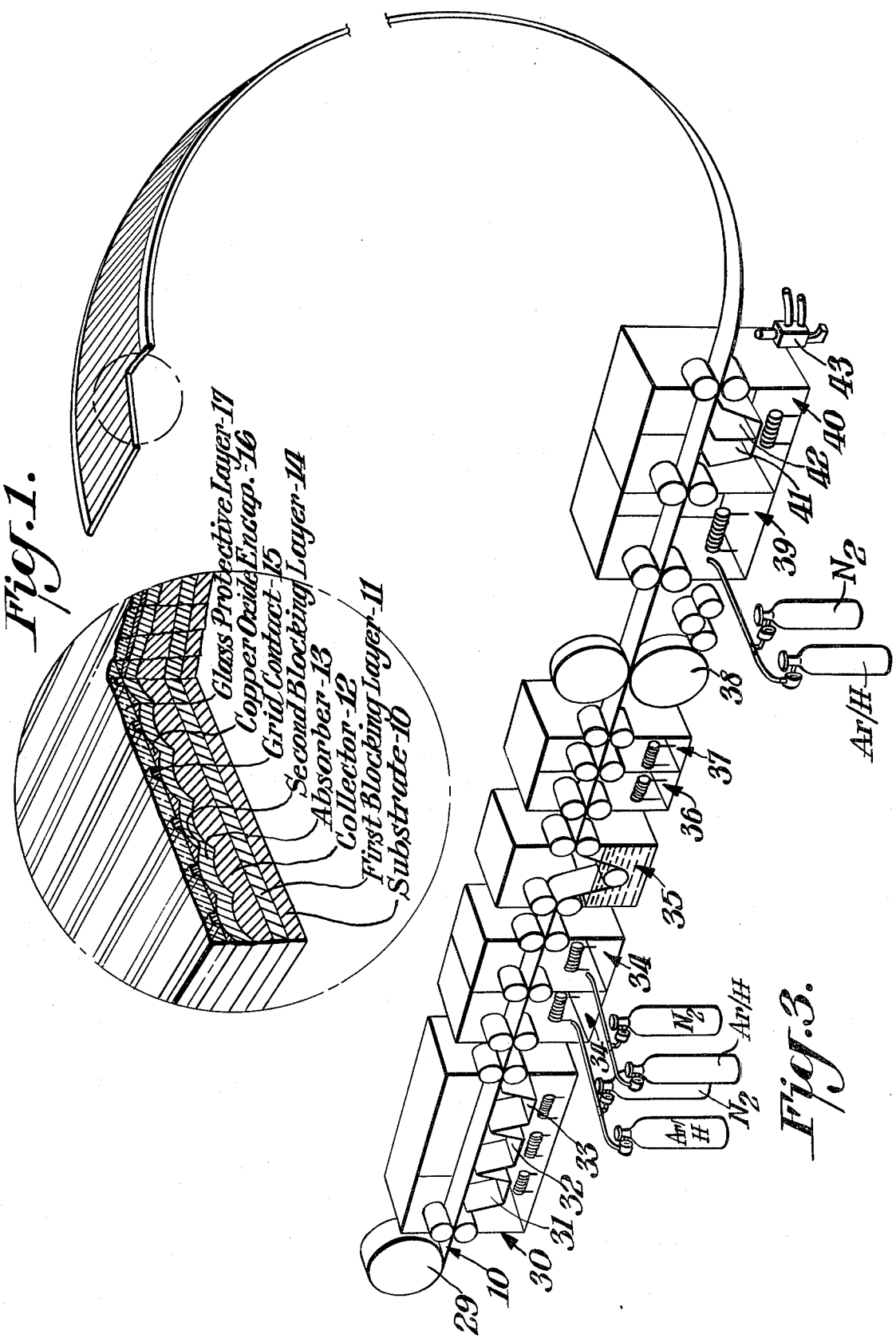

Fig.2.

1 - Provide Reel Of Elongated Flexible Conductive Substrate.

↓

2 - Deposit Zinc Sulfide Blocking Layer By Vacuum Evaporation. (Optional)

↓

3 - Deposit CdS-Type Collector By Vacuum Evaporation.

↓

4
- Deposit Cuprous Chloride On CdS By Vacuum Evaporation.
- Form Copper Sulfide Absorber By Heating Structure In Reducing Atmosphere.
- Remove ByProduct

↓

5 - Form Junction By Heating In Reducing Atmosphere.

↓

6 - Form Additional Blocking Layer By Heating In Oxygen Containing Atmosphere (Opt.)

↓

7 - Apply Contact Grid By Printing.

↓

8
- Deposit Copper Oxide By Vacuum Evaporation.
- Apply Glass Encapsulant.

4,318,938

METHOD FOR THE CONTINUOUS MANUFACTURE OF THIN FILM SOLAR CELLS

BACKGROUND OF INVENTION

The Nature of Photovoltaic Cells

A photovoltaic cell, often referred to as a solar cell, is a semiconductor junction device which converts light energy into electrical energy. A typical photovoltaic cell is a layered structure comprising four principal layers: (1) an absorber-generator (2) a collector-converter (3) a transparent electrical contact, and (4) an opaque electrical contact. When light is shone onto the absorber-generator, the device generates between the two contacts a voltage differential which increases as the intensity of the light increases.

The absorber-generator (commonly referred to as the "absorber") is a layer of semiconductor material which absorbs light photons and, as a consequence, generates minority carriers. Typically, the absorber captures photons and ejects electrons thus creating pairs of negatively charged carriers (electrons) and positively charged carriers ("holes"). If the absorber is a p-type semiconductor, the electrons are minority carriers; if it is n-type, the holes are minority carriers. As minority carriers are readily annihilated in the absorber by recombination with the plentiful majority carriers, they must be transported to a region wherein they are majority carriers before they can be utilized to power an electrical circuit.

The collector-converter (the "collector") is a layer of material in electrical contact with the absorber wherein the majority carriers are of the same conductivity type as the minority carriers generated in the absorber. This layer "collects" minority carriers from the absorber and "converts" them into majority carriers. If the collector is an oppositely doped region of the same semiconductor as the absorber, the photovoltaic device is a p-n junction or homojunction device. If the collector is comprised of a different semiconductor, the device is a heterojunction; and, if the collector is metal, the device is a Schottky junction.

The transparent contact is a conductive electrical contact which permits light to pass through to the absorber. It is typically either a continuous transparent sheet of conductive material or an open grid of opaque conductive material. If the transparent contact is on the same side of the photovoltaic device as the absorber, the device is referred to as being in the front wall configuration. If the transparent contact is on the opposite side, the device is said to be in the back wall configuration.

History of the Art

Although scientists have known about the photovoltaic effect for more than a century, it is only within the past twenty-five years that is could be considered a practical means for generating electricity in useful amounts. Prior to 1950, photovoltaic devices were limited in use to highly specialized applications, such as light metering, wherein conversion efficiency was immaterial and electrical current demand was minimal.

The advent of silicon junction technology in the 1950's permitted the development of high cost, high conversion efficiency silicon junction photovoltaic cells. Arrays of such devices have been used with considerable success in the space program where cost is of little significance. However, the cost of such devices as energy generators, typically higher than $10,000 per kilowatt, is prohibitively high for terrestrial applications wherein they must complete against conventional generators. While much of this cost is due to the high quality control standards required for spacecraft components, a substantial portion is due to the high cost of preparing silicon crystals of the required purity and due to the inefficiencies of the batch processes by which such cells are fabricated.

Thin film photovoltaic cells possess many potential advantages over silicon cells in terrestrial applications. Photovoltaic cells employing thin films of polycrystalline material such as a copper sulfide absorber and a cadmium sulfide converter offer substantial advantages for the development of continuous processing techniques, and they are flexible and light of weight. Consequently they offer much promise as cells which can be easily fabricated, transported and deployed.

One difficulty standing in the way of large-scale manufacture and deployment of thin film solar cells, is the unavailability of techniques for the low-cost production of durable, reliable cells. While high efficiency cells have been obtained using laboratory scale batch processes, cells of good efficiency have been difficult to reproduce consistently, and the operating lifetime of the cells produced has been uncertain. Moreover, a simple scale-up of the laboratory processes would present unduly high costs for labor and equipment since such a scale-up would only build larger pieces of equipment or proliferate the number of small scale batch equipment pieces. The continuous process results from analysis of batch data, development of mathematical models and synthesis into a design for commercial scale apparatus that is usually totally different in design than laboratory scale batch apparatus.

SUMMARY OF INVENTION

The present applicant has recognized that by the proper choice of processing steps, equipment and other solar cell components, one can fabricate durable, reliable solar cells by a low-cost continuous process suitable for large-scale manufacture. In substance, the technique involves providing a reel of thin metal foil substrate and forming on the substrate a series of layers operative to form a photovoltaic junction, short prevention blocking layers, contacts and integral encapsulation. The foil substrate is processed as a continuous reel substantially until final testing at which point, if desired, it can be cut into individual cells for deployment. An analysis of related costs shows that this technique can reduce, by as much as a factor of two, the total cost of manufacturing a cell in a manufacturing plant of 100 megawatts or larger.

BRIEF DESCRIPTION OF THE DRAWINGS

The nature, advantages and various additional features of the invention will appear more fully upon consideration of the illustrative embodiments now to be described in detail in connection with the accompanying drawings.

In The Drawings:

FIG. 1 is an enlarged fragmental cross section of the circled portion of the photovoltaic cell shown in FIG. 3 fabricated in accordance with the invention;

FIG. 2 is a flow diagram of the steps of a preferred method of fabricating a thin film photovoltaic cell in accordance with the invention; and FIG. 3 is a schematic pictorial view of the preferred arrangement of apparatus for practicing the method of FIG. 2.

DETAILED DESCRIPTION

In essence, the method of fabricating a thin film photovoltaic cell in accordance with the invention involves the steps of providing a reel or spool of thin metal foil substrate and continuously processing the substrate reel by forming on the substrate a series of successive layers operative to form a photovoltaic junction, shorts prevention blocking layers, contacts and integral encapsulation.

Referring to the drawings, FIG. 1 is an enlarged fragmental cross section of a typical thin film photovoltaic device fabricated in accordance with the invention. In essence, the device comprises, as successive components in the electrical path therethrough, a flexible conductive substrate 10 such as brass foil (about 12–50 microns thick). A thin film blocking layer 11 of zinc sulfide (0.005–2 microns thick) is disposed on the brass foil to prevent unwanted shorts in the device. A cadmium sulfide-type collector converter 12 (2–30 microns thick of CdS or $Zn_xCd_{1-x}S$; $0 \leq x \leq 0.3$) is disposed on the blocking layer, and a thin film of copper sulfide absorber-generator 13 is disposed on the collector defining a photovoltaic junction therebetween. A second blocking layer 14 (discontinuous) of cadmium sulfate is formed wherever the copper sulfide does not cover the cadmium sulfide in order to prevent unwanted shorts, and a transparent contact 15 such as a grid is applied in electrical contact with the absorber. Grid 15 may be of any suitable material such as a copper, gold, silver, nickel or other metal alloy grid electrode. The device is integrally encapsulated with a composite layer of copper oxide 16 (100–10,000 angstroms thick) and aluminoborosilicate glass 17 (1–30 microns thick).

FIG. 2 is a schematic flow diagram illustrating the preferred method, and FIG. 3 schematically illustrates an apparatus or assembly for practicing this method. As illustrated, the first step involves providing a reel 29 of flexible conductive substrate 10 such as brass foil having a thickness of 12 to 30 microns. Alternatively a layer of zinc-plated (0.3–1 micron thick) copper foil (12–50 microns thick) can be used.

As a preliminary step, the flexible substrate 10 is thoroughly cleaned. Cleaning is preferably effected by unwinding the substrate from its reel, passing it through a cleaning station (not shown in FIG. 2) comprising a vapor degreaser and an acid pickling bath. Organic contaminants are removed by vapor degreasing with methylene chloride or 1,1,1,-trichloroethane. Oxides are removed by pickling in a 10% v/v sulfuric acid bath. Subsequent to cleaning, the foil is rinsed with deionized water and dried by a stream of compressed air or nitrogen.

The next step involves forming or depositing on the flexible substrate 10, a blocking layer 11 for preventing unwanted shorts between the electrical contacts in the finished device, such as is described in co-pending application Ser. No. 944,999 entitled "Method For Increasing The Yield And Reliability Of Large Area, Thin Film Photovoltaic Cells", filed Sept. 22, 1978 in the name of Allen Barnett and assigned to applicant's assignee, now abandoned. The details of that application are incorporated herein by reference thereto. A zinc-sulfide blocking layer 0.005 micron to 2.0 microns average thickness is deposited on the brass foil by vacuum evaporation, chemical deposition or painting. Preferably the zinc sulfide is deposited by passing the flexible substrate 10 into a continuous vacuum evaporation coating unit 30 wherein the foil is passed adjacent a first deposition chamber 31 comprising a heated source of zinc sulfide. The temperature of the source, source-to-foil distance and the foil speed are adjusted to produce on the foil a layer of zinc sulfide having a thickness of 0.005 micron to 2 microns. Typical parameters are:

Source temperature 1250° to 1600° K.
Substrate temperature—450° to 570° K.
Source to substrate distance—5 to 20 cm
Rate of layer formation—2 to 10 microns per minute The third step involves forming or depositing the collector-converter 12. Preferably a collector of cadmium sulfide (CdS) or zinc cadmium sulfide ($Zn_xCd_{1-x}S$; $0 \leq x \leq 0.3$) is deposited by passing the processed foil in the coating unit 30 adjacent a second deposition chamber 32 comprising a heated source of cadmium sulfide. The temperature of the source, the source-to-foil distance and the foil speed are adjusted to produce on the foil a layer of cadmium sulfide having a thickness of 2 to 30 microns and preferably 2 to 4 microns. Typical parameters are:

Source temperature—1170° to 1470° K.
Substrate temperature—450° to 570° K.
Source to substrate distance—5 to 10 cm
Rate of layer formation—1 to 5 microns per minute Preferably the cadmium sulfide is coated using the apparatus for continuous deposition disclosed in the co-pending application entitled "Apparatus And Method For Continuous Deposition By Vacuum Evaporation" Ser. No. 43,317 filed concurrently herewith by Bill N. Baron, Richard Rocheleau and T. W. Fraser Russell and assigned to applicant's assignee.

The next step involves forming or depositing the absorber-generator 13. Preferably a copper sulfide absorber is formed by depositing on the calcium sulfide a conformal layer of a copper compound by vacuum evaporation or chemical deposition and forming copper sulfide by heating the structure in an inert or reducing atmosphere. A conformal layer of cuprous chloride is advantageously deposited by passing the processed foil in coating unit 30 adjacent a third deposition chamber 33 comprising a heated source of cuprous chloride. The temperature of the source, source-to-foil distance and the foil speed are adjusted to produce on the foil a layer of cuprous chloride having a thickness of 0.1 to 1.0 micron thick. Typical parameters are:

Source temperature—800° to 1200° K.
Substrate temperature—300° to 370° K.
Source-to-substrate distance—5 to 20 cm.
Deposition rate—1 to 5 microns per minute.

Copper sulfide is then grown on the CdS by passing the processed foil into an oven 34 to heat it in an inert or reducing atmosphere to effect ion exchange between the CdS and the cuprous chloride. Heating for five minutes at 170° C. in a nitrogen or argon/hydrogen atmosphere is sufficient to complete the ion exchange reaction. The reaction byproducts are then removed by rinsing with water or alcohol at a bath 35 and the surface is dried by a stream of dry nitrogen (apparatus not shown). Alternatively, the byproducts can be removed by plasma etching.

It should be noted that deposition of the first blocking layer, the collector layer and the cuprous chloride precursor to the absorber layer can all take place within the same vacuum deposition unit 30 having separate deposition chambers arranged serially such that the moving substrate continuously passes over them in sequence. The substrate can be continuously fed from atmospheric pressure into and through the unit and subsequently exit to atmospheric pressure. Continuous vacuum coating units manufactured by Airco Temescal, Berkeley, Calif. 94710 and Leybold-Heraeus Vacuum Systems, Inc., Enfield, Conn. 06802 can be adapted to perform this function by providing them with a plurality of suitable deposition chambers.

The fifth step is to form an acceptable photovoltaic junction between the collector and absorber. This step is preferably effectuated by passing the processed foil through a second oven 36 for heating it to a temperature of 300° C. for about two minutes in a reducing atmosphere such as nitrogen or 90% argon/10% hydrogen. Alternatively, lower temperatures can be used for longer periods of time, e.g., 170° C. for 15 hours. During the heat treatment, copper diffuses into the cadmium sulfide and dopes it at the interfacial region, and the reducing atmosphere chemically reduces oxides formed on the surface of the absorber.

The next step involves forming or depositing an additional blocking layer to prevent unwanted shorts between the collector and the soon-to-be deposited transparent electrical contact. A discontinuous blocking layer can be formed to cover any portion of the cadmium sulfide by passing the processed foil through a third oven 37 to heat it in an oxygen containing atmosphere to a temperature of about 200° C. for about two minutes. This heating in the presence of oxygen converts any exposed cadmium sulfide to insulating cadmium sulfate.

The seventh step involves application of a transparent contact 15. Preferably a copper grid is applied by passing the processed foil through a printing station 38 or, alternatively, through a vacuum deposition chamber where it is applied by vacuum evaporation through a mask. Contact printing, rotogravure printing or screen printing can all be used in the continuous process. Contact printing apparatus suitable for this application is manufactured by Affiliated Manufacturers Inc., North Branch, N.J. 08876, and suitable rotogravure apparatus is manufactured by Cerrutti America, Inc., Pittsburg Pa. 15244. The contact grid is connected to an electrical terminal bus separated from the foil by an insulator such as an organic dielectric with a thickness of 1 to 10 microns. The insulator can also be applied by printing.

The final step is the application of a composite copper oxide-glass integral encapsulant as disclosed in the copending application Ser. No. 43,316 entitled "Thin Film Photovoltaic Cells Having Increased Durability And Operating Life" filed concurrently herewith in the names of Allen Barnett et al and assigned, U.S. to applicants' assignee, now Pat. No. 4,239,553.

The encapsulation step can be effected by passing the processed foil through an oven 39 containing a reducing atmosphere to heat the foil and reduce any oxides on the copper sulfide. The foil is then passed through a vacuum deposition unit 40 adjacent a deposition chamber 41 comprising a source of heated copper oxide for depositing a layer of copper oxide having a thickness in the range from 100 angstroms to 10,000 angstroms.

Preferably the glass component is then deposited in two stages. A thin conformal layer of glass having a thickness of about one micron is applied by passing the processed foil in unit 40 adjacent a second vacuum deposition chamber 42 comprising a source of glass and a thicker layer of the same glass having a thickness of up to 30 microns can be deposited on the foil after it exits from unit 40 by passing it adjacent a flame spray or plasma spray deposition unit 43. Flame or plasma spray units suitable for this use are marketed by Metco, Inc., Westbury N.Y. 11590. The glass layer may also be applied by sputtering vacuum evaporation or ion plating techniques.

A preferred glass composition for this application is an alumino-boro-silicate glass having oxide components in the following proportions by mole percentage:

| | |
|---|---|
| $SiO_2$ | 49% |
| $B_2O_3$ | 14.5% |
| $Al_2O_3$ MgO | 10.5% |
| BaO | 25% |
| PbO | 1% |

Next, if desired, an anti-reflection layer can be added to the glass by texturing the surface in a way to minimize any light reflection back into the atmosphere. This can be done by providing irregularities in the nature of 0.5–1 microns in diameter and approximately 1–2 microns deep.

Finally the thus processed substrate can be cut into individual cells or can be rewound on a storage reel (not shown).

It will be appreciated that each of the process steps described above and each component of the processing apparatus are suitable for the continuous processing of the flexible substrate. Thus the foil substrate, from the time it is unwound from reel 29, is continuously processed by continuously passing it through successive processing stations. Such minor differences in time as may be produced by using convenient-sized processing units may be readily compensated for by the use of conventional mechanical buffering arrangements.

Other alternatives include applying the ohmic contact after the blocking insulator is applied as described in application Ser. No. 944,999, now abandoned. In such case, the blocking insulator is applied before the ohmic contact which will consist of a 0.005 to 2 micron thick layer of glass which may be deposited either by the flame or plasma spray technique, or, alternately, vacuum or chemical deposition. After the application of the blocking insulator, the zinc contact will be applied. The zinc contact to the substrate will depend on a porosity of 1 to 5 percent in a glass layer to be good enough to form an ohmic contact.

An alternate way of forming the grid electrical contact would be to form the metal grid on top of the copper oxide layer, since the copper oxide is a conductor. The interchange of the grid on the copper oxide layer would be based on performance of the device, cost and long-term reliability for specific applications.

Another alternate method includes the formation of the anti-reflection layer by texturing the cadmium sulfide (zinc cadmium sulfide layer) using a standard anti-reflection etch described in copending application Ser. No. 944,999, filed Sept. 22, 1978. Similarly the copper sulfide layer can be formed by a wet process as described in Ser. No. 944,999.

While the invention has been described in connection with but a small number of specific embodiments, it is to be understood that these are merely illustrative of the many other specific embodiments which can also utilize the principles of the invention. Thus numerous and varied other processes and apparatus can be deviced by those skilled in the art without departing from the spirit and scope of the present invention. For example the invention has been described with respect to forming a front wall photovoltaic cell but can also be practiced by using analogous technology to form a rear wall cell where the locations of the collector and absorber-generator are reversed as also described in Ser. No. 944,999.

What is claimed is:

1. A method for the substantially continuous fabrication of thin film solar cells by performing, on a substantially continuously moving, elongated, flexible conductive substrate, the following steps:
   (a) depositing a first semiconductor layer on the said conductive substrate with the conductive substrate a first electrical contact;
   (b) depositing a second semiconductor layer on said conductive substrate;
   (c) forming an electrical junction between said first and said second semiconductor layers; and
   (d) applying a second electrical contact to the unit resulting from said conductive substrate and from said first and said second semiconductor.

2. The method of claim 1 wherein the solar cells are rear wall cells and said second semiconductor layer is deposited in electrical contact with said conductive substrate, and then said first semiconductor layer is deposited on said second semiconductor layer.

3. The method of claim 1 wherein the solar cells are front wall cells and said first semiconductor layer is deposited in electrical contact with said conductive substrate, and then said second semiconductor layer is deposited on said first semiconductor layer.

4. The method of claim 3 wherein said first semiconductor layer is made from a cadmium sulfide-type material, including the steps of depositing on said first semiconductor a layer of copper-containing compound, forming said second semiconductor as a copper sulfide semiconductor by heating the structure to effect an ion exchange reaction between said copper-containing compound and said first semiconductor, removing the byproducts of said ion exchange reaction, and forming said junction by heating in a reducing atmosphere.

5. The method of claim 4 wherein said first semiconductor and said copper-containing compound are deposited by vacuum evaporation.

6. The method of claim 4 wherein said copper-containing compound is cuprous chloride.

7. The method of claim 4 wherein said flexible conductive substrate is a material selected from the group consisting of brass and zinc-plated copper and including the additional step of forming a zinc sulfide layer between said substrate and said first semiconductor.

8. The method of claim 4 including the additional step of forming a discontinuous cadmium sulfate layer for preventing unwanted shorts between said first semiconductor and said second electrical contact.

9. The method of claim 4 including the additional step of applying over the second semiconductor a composite integral encapsulating member comprising an inner layer of copper oxide and an outer layer of glass.

10. The method of claim 4 including forming an antireflection layer by texturizing said cadmium sulfide by an etching step.

11. The method of claim 10 wherein a further layer is formed on said substrate before said electrical contact is applied thereto.

12. The method of claim 3 wherein said second semiconductor. is a copper sulfide layer applied by a wet process.

13. The method of claim 1 including applying an encapsulating member after the ohmic electrical contact is applied.

14. The method of claim 1 wherein said substrate is conductive by applying an electrical contact thereon to act as said first electrical contact.

15. A method for the substantially continuous fabrication of thin film solar cells by substantially continuously passing an elongated, flexible conductive substrate past a series of treatment stations and performing the following process steps:
   (a) depositing a zinc sulfide layer by vacuum evaporation;
   (b) depositing a cadmium sulfide-type semiconductor by vacuum evaporation;
   (c) depositing a layer of cuprous chloride by vacuum evaporation;
   (d) forming a copper sulfide semiconductor by heating the structure to effect an ion exchange reaction between said cadmium sulfide-type semiconductor and said cuprous chloride;
   (e) removing the byproducts of said ion exchange reaction;
   (f) forming an electrical junction between the semiconductor layers by heating in a reducing atmosphere;
   (g) forming a discontinuous cadmium sulfate layer by heating in an oxygen-containing atmosphere;
   (h) applying an electrical contact grid to the copper sulfide semiconductor by printing;
   (i) depositing a copper oxide layer over the copper sulfide semiconductor by vacuum evaportion; and
   (j) depositing a glass layer over the copper oxide layer.

* * * * *